(12) United States Patent
Zhou et al.

(10) Patent No.: US 8,397,140 B2
(45) Date of Patent: Mar. 12, 2013

(54) ERROR CORRECTION CODING FOR RECOVERING MULTIPLE PACKETS IN A GROUP VIEW OF LIMITED BANDWIDTH

(75) Inventors: Xiaosong Zhou, Campbell, CA (US); Hyeonkuk Jeong, Saratoga, CA (US); Yan Yang, San Jose, CA (US); Dazhong Zhang, Milpitas, CA (US); Hsi-Jung Wu, San Jose, CA (US)

(73) Assignee: Apple Inc., Cupertino, CA (US)

( * ) Notice: Subject to any disclaimer, the term of this patent is extended or adjusted under 35 U.S.C. 154(b) by 300 days.

(21) Appl. No.: 12/794,613

(22) Filed: Jun. 4, 2010

(65) Prior Publication Data

US 2011/0302473 A1 Dec. 8, 2011

(51) Int. Cl.
*H03M 13/00* (2006.01)
(52) U.S. Cl. ........................................ 714/781; 714/786
(58) Field of Classification Search .................. 714/752, 714/781, 784
See application file for complete search history.

(56) References Cited

U.S. PATENT DOCUMENTS

| | | | | |
|---|---|---|---|---|
| 7,523,382 B2 * | 4/2009 | Kim et al. | ...................... | 714/776 |
| 7,577,898 B2 * | 8/2009 | Costa et al. | ................... | 714/776 |
| 7,617,436 B2 * | 11/2009 | Wenger et al. | ................ | 714/758 |
| 7,668,712 B2 * | 2/2010 | Wang et al. | .................... | 704/219 |
| 7,920,501 B2 * | 4/2011 | Larsson et al. | ................ | 370/315 |
| 7,995,462 B2 * | 8/2011 | Gao et al. | ....................... | 370/216 |
| 8,140,941 B2 * | 3/2012 | Tanaka et al. | ................. | 714/764 |

\* cited by examiner

*Primary Examiner* — Esaw Abraham
(74) *Attorney, Agent, or Firm* — Meyertons, Hood, Kivlin, Kowert & Goetzel, P.C.

(57) ABSTRACT

Coded video data may be transmitted between an encoder and a decoder using multiple FEC codes and/or packets for error detection and correction. Only a subset of the FEC packets need be transmitted between the encoder and decoder. The FEC packets of each FEC group may take, as inputs, data packets of a current FEC group and also an untransmitted FEC packet of a preceding FEC group. Due to relationships among the FEC packets, when transmission errors arise and data packets are lost, there remain opportunities for a decoder to recover lost data packets from earlier-received FEC groups when later-received FEC groups are decoded. This opportunity to recover data packets from earlier FEC groups may be useful in video coding and other systems, in which later-received data often cannot be decoded unless earlier-received data is decoded properly.

26 Claims, 11 Drawing Sheets

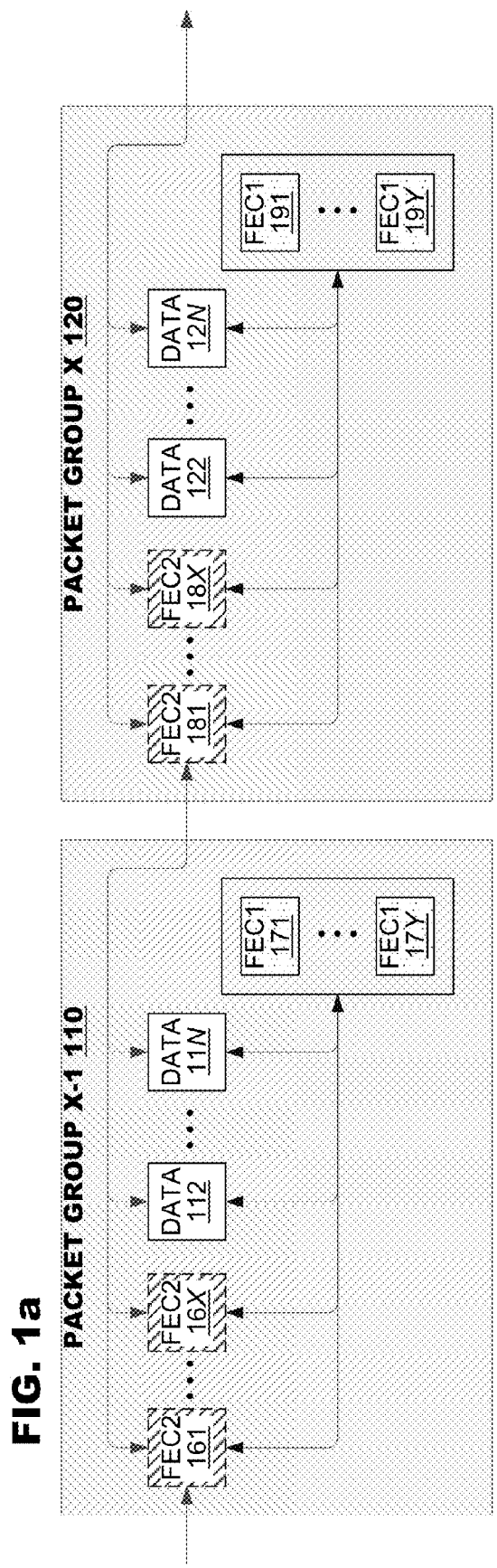

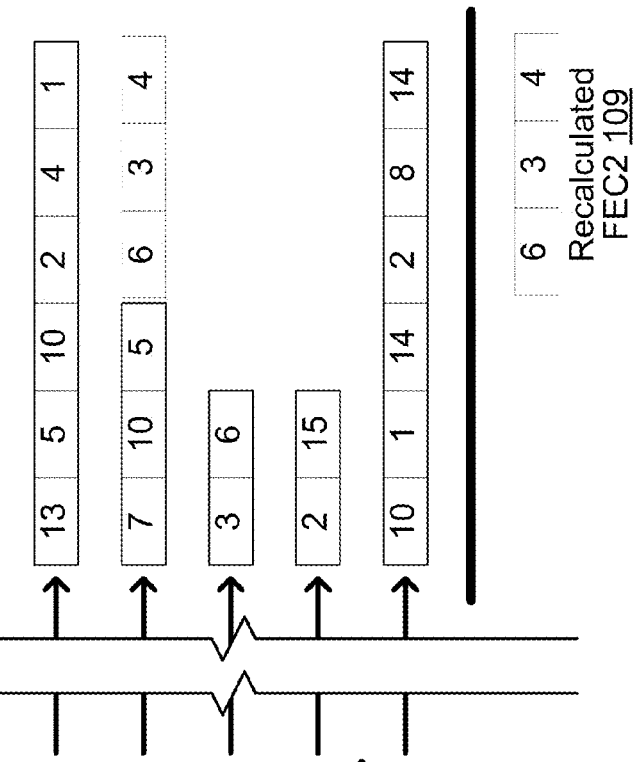
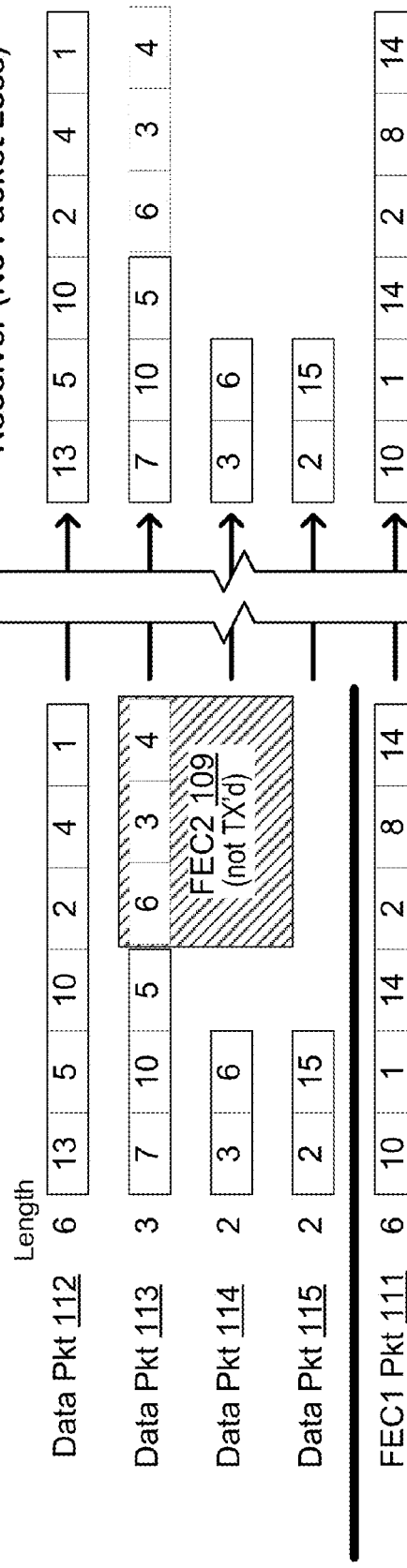
FIG. 2a
FIG. 2b

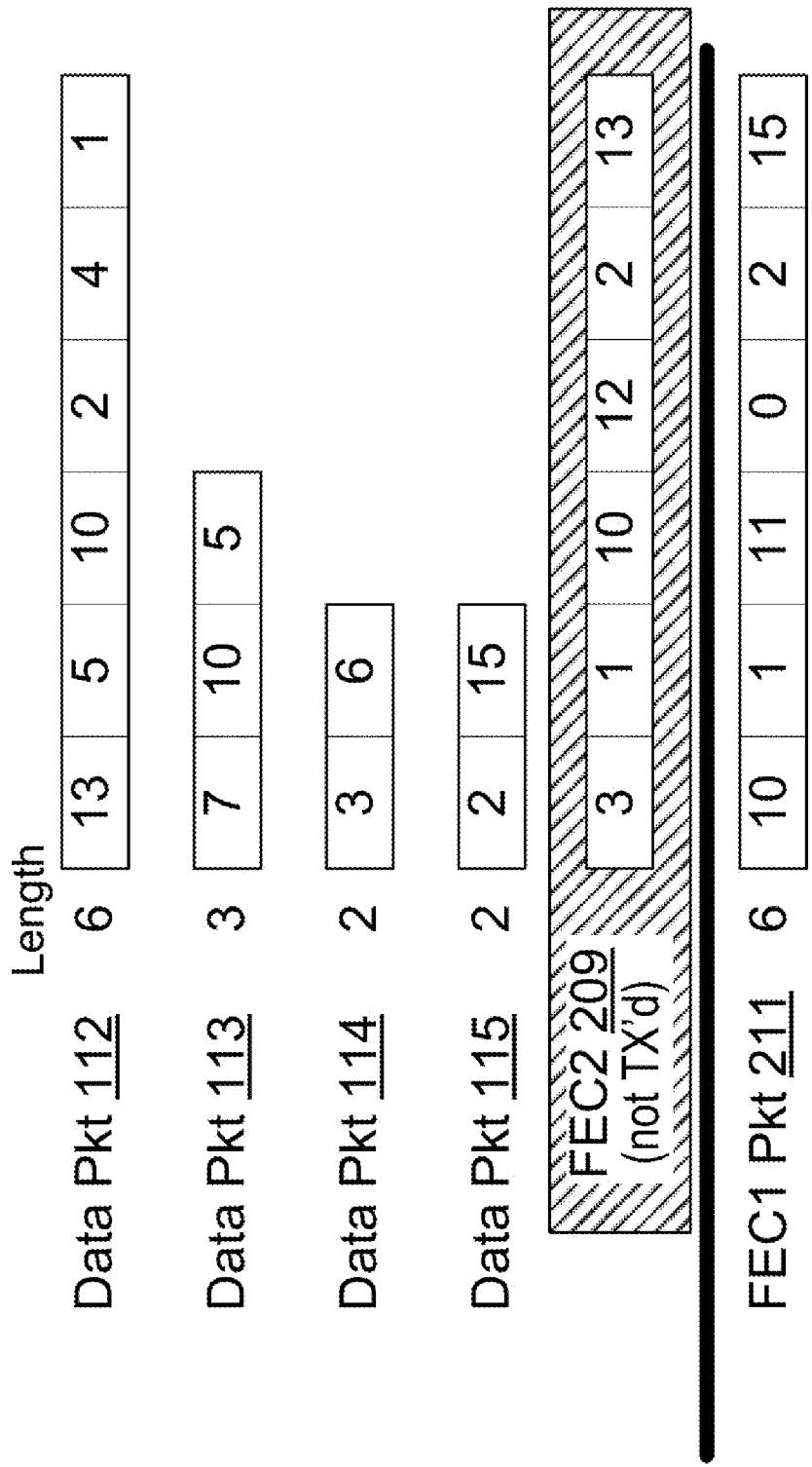

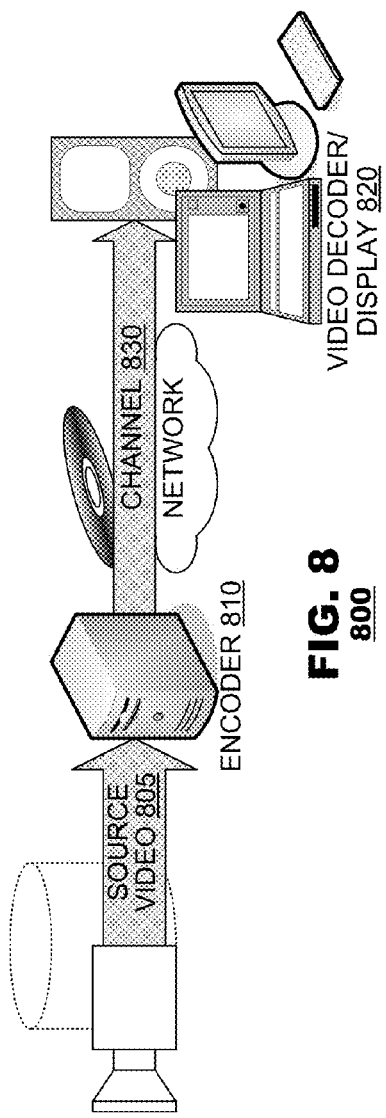
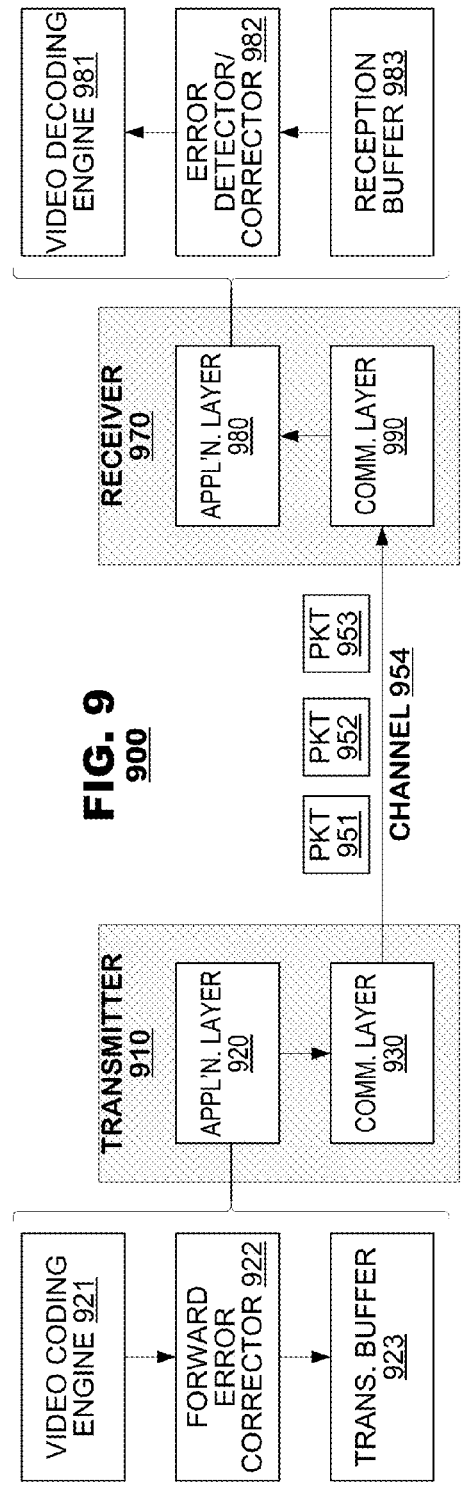

ERROR CORRECTION CODING FOR RECOVERING MULTIPLE PACKETS IN A GROUP VIEW OF LIMITED BANDWIDTH

BACKGROUND

Video encoding and transmission systems often use error control systems to detect and correct certain errors at a receiver without having to ask a sender for additional data to correct the error. Error control systems often use forward error correction (FEC) to add redundant data to video data during transmission. The redundant data can then be used by the receiver to reconstruct certain missing or altered data during transmission by reconstructing the data using the remaining accurately transmitted data and the redundant data.

An FEC calculation that determines the redundant data to be added may be performed at a transmitter from payload data. The result of this calculation may be appended to the payload data and transmitted with the payload data. When the payload data and FEC calculation result are received at a receiver, the receiver may perform the FEC calculation on the received payload data and compare a result of the calculation to the received result. If the results match, the transmitted data was successfully received. If the results do not match, the receiver may be able to correct transmission errors from the received payload data and FEC calculation result received at the receiver.

In video coding systems, video encoders and decoders may generate FEC codes from packets of coded video data. These generated FEC codes may be embedded in separate FEC packets and transmitted with the corresponding FEC codes, known as packet-level FEC. In existing packet-level FEC systems, a FEC error-recovery packet is added to each group of N packets that are transmitted. If one of the packets in the group is lost during transmission, the FEC error-recovery packet may be used in conjunction with the other received packets in the group to reconstruct the lost packet in the group. Packet-level FEC may be used with various protocols including User Datagram Protocol (UDP).

To improve the chances of being able to recover a lost packet in packet-level FEC, it is possible to lower the number N of packets in each of group, so that, instead of having one FEC error-recovery packet for every ten packets, there is one FEC error-recovery packet for every five packets. While this will lower the chances of having more than one missing packet in each group, increased bandwidth is required to transmit the additional FEC error-recovery packets as the packet ratios are lowered. Because many video transmission systems are bandwidth limited, the amount of FEC error-recovery packets that may be added to the video data during transmission is also limited.

To increase the chances of being able to recover packets lost during transmission, there is a need for an error control system and method that is able to recover more than one lost packet in a group in view of limited bandwidth.

BRIEF DESCRIPTION OF THE DRAWINGS

FIG. 1*a* is shows an exemplary configuration of data packet groups with multiple FEC parity packets in an embodiment.

FIG. 2*a* shows an first exemplary embodiment of how a transmitter would encode a FEC packet.

FIG. 2*b* shows an exemplary embodiment of how a receiver would decode a FEC packet.

FIG. 2*c* shows an alternative embodiment of how a transmitter would encode a FEC packet based on different data.

FIG. 8 shows an exemplary encoder and decoder configuration that may be used in an embodiment.

FIG. 9 shows an exemplary configuration of a transmitter and a receiver in an embodiment.

DETAILED DESCRIPTION

Embodiments of the invention may transmit coded video data between an encoder and a decoder using FEC codes (FEC "packets," herein) for error detection and correction in an erasure channel. In an erasure channel, transmitted packets may be either wholly received or lost. Transmitted packets that are incomplete or altered when received may be dropped and treated as lost by lower layers in a network stack. The term forward error correction or "FEC" may include any error control technique where redundant information is added to a message and used to reconstruct the message in the event of a transmission error.

In an embodiment, only a subset of generated FEC packets need be transmitted between the encoder and decoder. The FEC packets that are generated for each FEC group may take, as inputs, data packets of a current FEC group and also one or more untransmitted FEC packet of a preceding FEC group. A FEC group may include a set of N data packets to be transmitted as well as one or more FEC packets for the set of N data packets that are also to be transmitted as in packet-level FEC. Although each FEC packet in each FEC group is determined, in part, from at least one untransmitted FEC packet of a preceding FEC group, the untransmitted FEC packets themselves may not be included in any of the FEC groups. Due to relationships among the FEC packets, when transmission errors arise and data packets are lost, there remain opportunities for a decoder to recover lost data packets from earlier-received FEC groups when later-received FEC groups are decoded. This opportunity to recover data packets from earlier FEC groups is particularly useful in video coding systems, in which later-received data often cannot be decoded unless earlier-received data is decoded properly.

For convenience, the present discussion refers to transmitted FEC packets in each FEC group as "FEC1" and untransmitted FEC packets in each FEC group as "FEC2." Each FEC group may include one or more FEC1 and FEC2 packets, as explained below. Further, as explained below, the FEC1 and FEC2 packets from a current FEC group may be generated using the FEC2 values from a prior FEC group as an input, along with data packets of the current FEC group.

Figure 1:
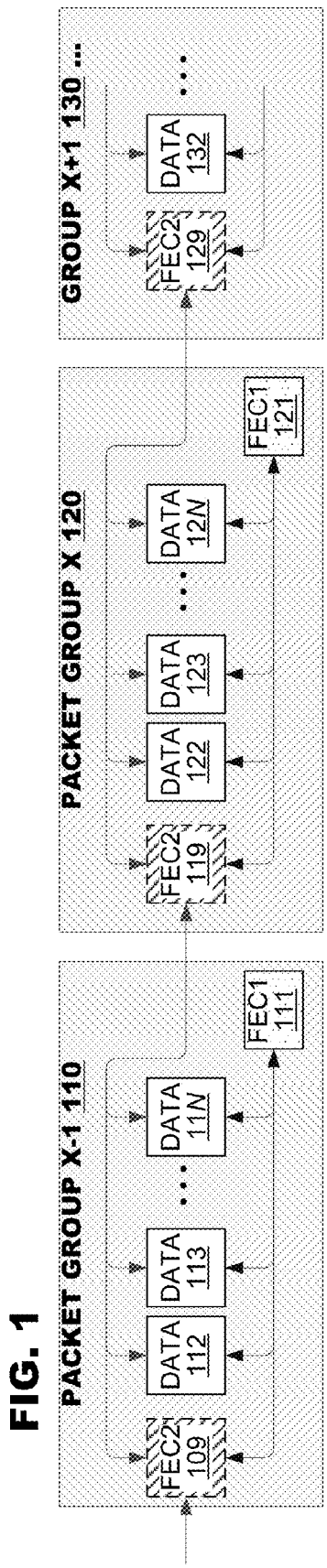
FIG. 1 shows an exemplary configuration of data packet groups in an embodiment.

FIG. 1 shows an exemplary configuration of data packet groups in an embodiment of the present invention. In this configuration, the packets containing payload data to be transmitted are shown as data packets 112 to 11N, 122 to 12N, and 132, which appear in a plurality of FEC groups 110-130. As illustrated, N corresponds to a number of data packets in each group; this number may vary from group to group. As illustrated, packets 112 to 11N may be included in group X−1 110, data packets 122 to 12N may be included in packet group X 120, and data packets 132 to 13N (only packet 132 is shown) may be included in packet group X+1 130. This pattern may continue indefinitely for as long as data transmission is needed.

Also included in packet group X−1 110 may be FEC1 packet 111, which may be transmitted with the data packets 112 to 11N. FEC1 packet 111 may be calculated using a predetermined mathematical function applied to the data packets 112 to 11N in group X−1 110 and also applied to the FEC2 109 value calculated for the packets in a group X−2 (not shown). Different error correcting codes may be used to calculate values associated with one or more FEC packets. Reed-Solomon code is one example of error correcting code that may be used to correct multiple packet losses in a group.

FEC2 109 may not be transmitted, but instead used in the calculation of FEC1 111. FEC1 111 may be transmitted with data packets 112 to 11N. FEC2 109 may also be used in the calculation of FEC2 119 in packet group X 120. FEC2 119 may also not be transmitted.

Packet group X 120 may include FEC1 packet 121 and data packets 122 to 12N. The value included in the FEC1 packet 121 may be calculated by applying a predetermined mathematical function to the value of FEC2 119 and values of data packets 122 to 12N. FEC2 119 may be calculated using a different predetermined mathematical function used to calculate FEC1 111.

The value included in FEC1 packet 121 may be calculated using a predetermined mathematical function applied to calculated FEC2 119 and data packets 122 to 12N. While data packets 122 to 12N may be transmitted along with FEC1 packet 121, the calculated FEC2 value 119 may not be transmitted.

Packet group X+1 130 may include a FEC1 packet (not shown) and additional data packets (only data packet 132 is shown). The FEC1 packet and additional data packets may transmitted while the calculated FEC2 value 129 may not be transmitted. FEC2 value 129 may be calculated using a predetermined mathematical function applied to previously calculated FEC2 119 and data packets 122 to 12N in group X 120.

FEC2 values for a packet group may be calculated by applying a mathematical function, which may include a polynomial function, to the values of data packets in the preceding packet group as well as the FEC2 value used in the preceding packet group. While FEC2 values may be calculated for each group of data packets, the calculated FEC2 values may only be used to calculate FEC1 values and may not be transmitted.

Although the FEC1 value for an initial group of packets and the FEC2 value used in the FEC1 calculation for the following group are both calculated using the same data packets and FEC2 values, the values of FEC1 and FEC2 may be different since the predetermined mathematical functions for calculating FEC1 and FEC2 may be different from each other. The functions used to generate FEC1 and FEC2 values may be based on the particular error correction coding scheme that is selected. For example, Reed-Solomon coding, or other coding functions may be used to generate distinct FEC1 and FEC2 values. Alternatively, FEC1 values may be generated from different mathematical functions altogether from FEC2 values. For example, FEC1 may be calculated from simple non-carrying parity check code by linear addition, while FEC2 may be generated from another FEC coding scheme, such as Reed-Solomon, though other error correction coding functions may be used in other embodiments as long as the FEC1 and FEC2 functions are independent.

If Reed-Solomon coding is selected for FEC2, the mathematical function may involve multiplying a message polynomial p(x) by a generator polynomial g(x). Alternatively, the mathematical function f(x) may involve multiplying the message polynomial p(x) by $x^t$ to provide t check symbols and then subtracting any remainder from a division by g(x) to generate a multiple of g(x):

$$f(x) = p(x) \times x^t - ((p(x) \times x^t) \bmod g(x))$$

A parity check matrix H of Reed-Solomon code over a finite field GF(q) may also be denoted as follows, where α is the primitive element over the finite field and t is the number of errors or lost packets that may be recovered:

$$H = \begin{bmatrix} 1 & \alpha & \alpha^2 & \cdots & \alpha^{q-2} \\ 1 & \alpha^2 & (\alpha^2)^2 & \cdots & (\alpha^2)^{q-2} \\ \vdots & \vdots & \vdots & \ddots & \vdots \\ 1 & \alpha^t & (\alpha^t)^2 & \cdots & (\alpha^t)^{q-2} \end{bmatrix}$$

A codeword C of this Reed-Solomon code may be selected so that, H×C=0, where C may be a column vector with elements from the finite field. For example, if $q=16=2^4$, elements over the finite field may be represented by polynomials of degrees less than 4 and with coefficients of either 0 or 1. When we use primitive polynomial $1+x+x^4$ to generate $GF(2^4)$, primitive element α and $\alpha^4$ may be represented in binary form as (0010) and (0011), respectively.

Thus, for a Reed-Solomon code over $GF(2^4)$ and t=7, with binary input vector [0001 0010 0011 0110 0101 0110 0111 1000], the parity vector may be generated as [1100 1010 1010 1100 0101 1011 0010]. The codeword C may therefore be: [0001 0010 0011 0110 0101 0110 0111 1000 1100 1010 1010 1100 0101 1011 0010]$^T$.

While error correcting coding functions such as Reed-Solomon coding algorithms may be used to generate both FEC2 and FEC1 packets, other forward error correcting algorithms may also be used. For example, low-density parity check (LDPC), BCH, and turbo coding algorithms may be used instead. In some situations where certain functions, such as certain high order Reed-Solomon polynomial functions, are used to calculate FEC1 and/or FEC2, it may be possible to recover more than one lost packet from a packet group.

Some embodiments may include multiple FEC1 packets that are transmitted with data packets in a packet group and/or multiple FEC2 packets that may be used in FEC calculations but may not be transmitted. FIG. 1a is shows an exemplary configuration of data packet groups with multiple FEC parity packets in an embodiment. In this embodiment, packet group X−1 110 may include data packets 112 to 11N that may be transmitted. Multiple FEC packets, including FEC1 171 to 17Y and FEC2 181 to 18X may be generated from data packets 112 to 11N in packet group X−1 110 and the untransmitted FEC2 values 161 to 16X calculated from the previous packet group X−2 (not shown).

FEC1 packets 171 to 17Y may be transmitted with data packets 112 to 11N, while FEC2 packets 161 to 16X may not be transmitted. As illustrated, X and Y may correspond to the number of respective FEC2 and FEC1 data packets obtained from applying error correcting coding functions to designated data packets and untransmitted FEC2 values calculated from previous packet groups. X and/or Y may vary from group to group.

Untransmitted FEC2 packets 181 to 18X may be used, along with data packets 122 to 12N in packet group X 120, to calculate FEC1 packets 191 to 19Y and untransmitted FEC2 packets to be used in next packet group X+1 (not shown). The calculated FEC1 packets 191 to 19Y may be transmitted with data packets 122 to 12N in packet group X 120, while FEC2 packets 181 to 18X may not be transmitted.

Figure 1B:
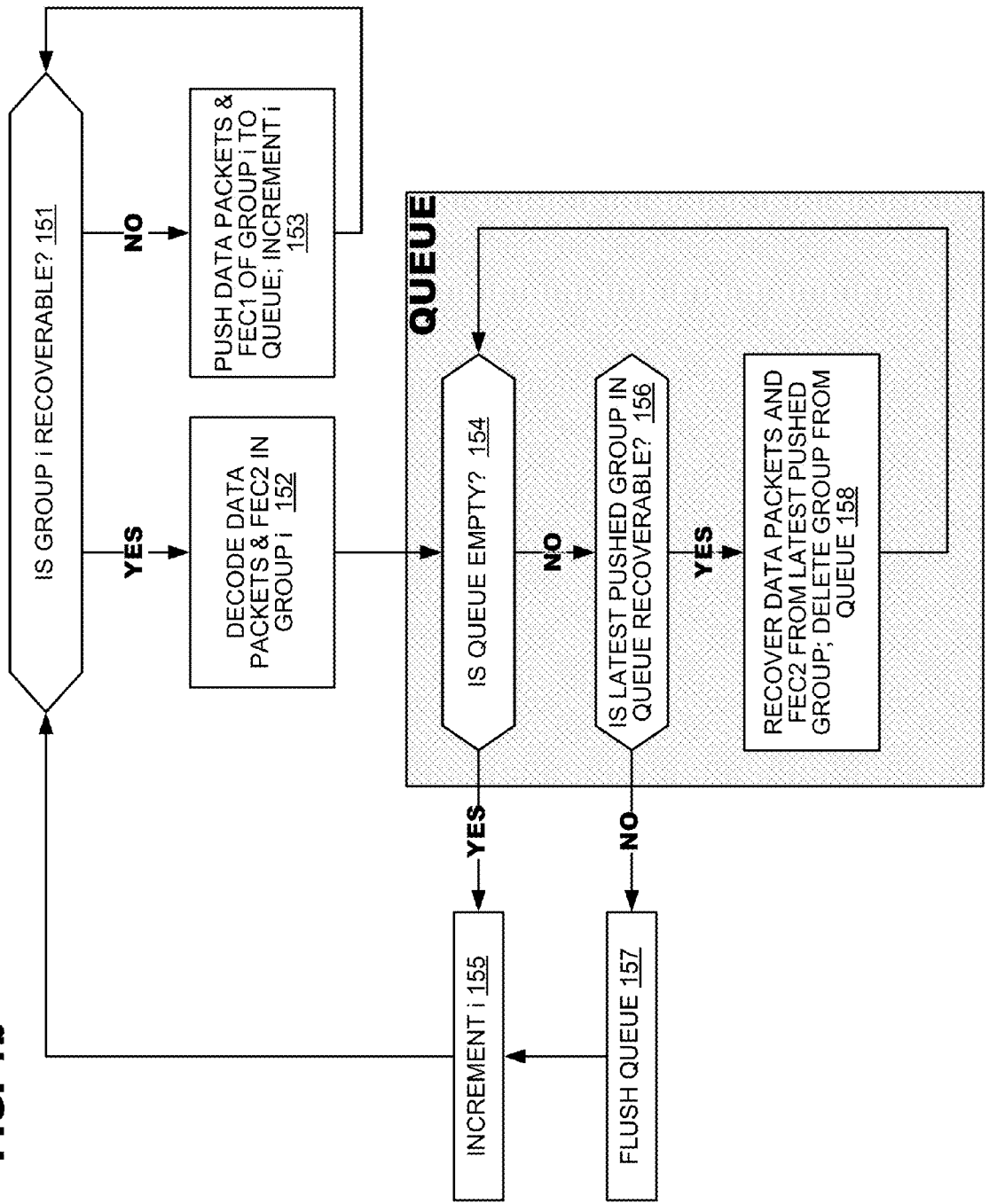
FIG. 1*b* shows an exemplary process for decoding received packets in an embodiment.

FIG. 1b shows an exemplary process for decoding packets at a receiver starting with a received FEC group i, where i may be whole number. In box 151, the packets in FEC group i may be analyzed to determine whether the packets in group i are recoverable from the packets in the group that were actually received at the receiver.

If the packets in group i are not recoverable from the packets in group i that were actually received, then, in box 153, all of the packets in group i that were actually received may be pushed into a queue, the counter i may be incremented, and the process may go to box 151 to analyze the next group of packets.

If the packets in group i are recoverable from the packets in group i that were actually received, then, in box 152, the packets in group i may be recovered and decoded and the untransmitted FEC2 value used to calculate FEC1 for group may also be calculated.

In box 154, the queue may be checked to determine whether it is empty or contains pushed packets, such as those pushed from box 153.

If the queue is empty, in box 155 the counter i may be incremented and the process may return to box 151 to analyze the next received FEC group.

If the queue is not empty, then once the packets in group i have been recovered and untransmitted FEC2 value has been recalculated, the received packet group most recently added to the queue may be analyzed in box 156 to determine whether the most recently added packet group may be recoverable from the packets that have been recovered and/or recalculated thus far.

If the most recently added packet group is not recoverable, then the queue may be flushed in box 157, and the process may return to box 155 to increment the counter i and subsequently move on to focus on subsequent FEC groups.

If the most recently added packet group is recoverable, then the packets in the most recently added packet group may be recovered and decoded and the untransmitted FEC2 value used to calculate FEC1 for the most recently added group may also be calculated. This packet group may then be removed from the queue, and the process may return to box 154 to determine whether the queue is empty or whether it still contains other pushed packets.

FIG. 2 shows an exemplary embodiment of how a transmitter may encode and receiver may decode FEC packets in packet group X−1 110. For ease of illustration, FIGS. 2-6 show data packets to be transmitted that contain specific alphanumeric symbols unique to each figure, selected from a fixed space of 16 different alphanumeric symbols, which for illustrative purposes are uniquely identified with the numbers 0 to 15. In other implementations, different symbols, words, or codes may be used to represent data to be transmitted in the data packets and in the FEC values and/or FEC packets. Although the examples in FIGS. 2 to 6 contain similar data packet, FEC packet, and packet group labels similar to those in FIG. 1 to show an exemplary relationship between the figures, the values, symbols, and calculations described may be unique to each figure. In FIGS. 2 to 5, the symbol numbers in shaded regions are not transmitted.

Thus, in FIG. 2a, data packet 112 may contain six alphanumeric symbols to be transmitted that are represented by the numbers 13, 5, 10, 2, 4, and 1. Similarly data packet 113 may contain three symbols to be transmitted, represented by the numbers 7, 10, and 5; data packet 114 may contain two symbols, 3 and 6; and, data packet 115 may contain two symbols, 2 and 15.

Prior to generating a FEC1 packet 111 for these data packets in packet group X−1 110, a processing device may append the calculated value of FEC2 109 from the prior group of data packets to one or more data packets in the current group of data packets (in this case data packets 112 to 115 would be in the current group). In some embodiments, to ensure that no further bandwidth is need to transmit additional data, the calculated value of FEC2 109 may be appended to one or more data packets in the current group that are shorter than the longest packet in the group (in this case data packets 113, 114, and 115 are all shorter than the longest data packet 112). The calculated value of FEC2 109 may be appended to one or more of these shorter data packets so that the total length of each data packet in the group with the FEC2 109 bits appended does not exceed the length of the longest data packet in the group (in this case data packet 112). If the calculated value of FEC2 109 is appended to more than one data packet, FEC2 109 may be appended to the multiple data packets so that there is no overlap of FEC2 109 bit values when calculating FEC1 111.

In this case, the calculated FEC2 value 109 is three symbols long and represented by the symbols 6, 3, and 4. In this embodiment, the FEC2 value 109 and other FEC2 values may not be transmitted with data packets, such as packets 112 to 115, but may only be used to calculate FEC1 packet values. Although the value of FEC2 109 is shown as appended to data packet 113, FEC2 109 could have been appended to data packets 114 or 115 instead. Alternatively, one of the symbols of FEC2 109 (such as the symbol number 6) could have been appended to data packet 114 or 115 and the other two symbols (such as 3 and 4) could have been appended to data packet 113.

The length of each of the data packets in a group (in this case packets 112 to 115) may be recorded in a header of the packet group or other header, such as a header of FEC1 packet 111 (not shown). An identifier of the location of FEC2 values 109 may also be recorded in the header of FEC1 packet 111. This identifier may identify the data packet(s) to which the FEC2 value 109 was appended or it may identify the symbols positions to which FEC2 values were appended (in this case, for example, the identifier may indicate that the FEC2 value 109 were added to the fourth, fifth, and sixth symbol positions starting from the left of data packet 112.

As stated previously, FEC2 value 109 may be calculated by applying an error correcting function to the data packets in the preceding group of packets (such as group X−2 (not shown)) and the previously calculated FEC2 value. In the embodiment shown in FIG. 2, it is assumed that the result of the calculation generated symbol numbers 6, 3, and 4, which were then appended to data packet 113 as shown in FIG. 2a.

To generated the parity value FEC1 111, an error correction coding function may be applied to the symbols in each of the data packets 112 to 115 including the appended FEC2 value 109. A Reed-Solomon coding function may generate symbols shown in FIG. 2a as included in FEC1 packet 111. Thereafter, each of the data packets 112 to 115 and FEC1 packet 111 may be transmitted to a receiver.

FIG. 2b shows the data packet values that may be received at a receiver end assuming no loss of packets and that any packet errors have been corrected at communications layer of the receiver. In this case, the symbols received at the receiver end may direct correspond to the symbols initially transmitted by the transmitter. The value of FEC2 109 may be recalculated from the coding function. Header information in FEC1 packet 111 may also be used to identify the specific bit locations of where the FEC2 value 109 was added to the data packets.

FIG. 2c shows another embodiment in which the untransmitted FEC2 value 209 is not appended to any of data packets to be transmitted, but is instead included in the FEC1 calculation as a separate packet. In this embodiment, the FEC2 value 209 may correspond to symbols represented by the numbers 3, 1, 10, 12, 2, and 13. The parity value FEC1 211 may be obtained by applying a Reed-Solomon coding function to data packets 112 to 115 and FEC2 value 209. In this example, only packets 112, 113, 114, 115, and 211 may be transmitted to the receiver.

Figure 3:
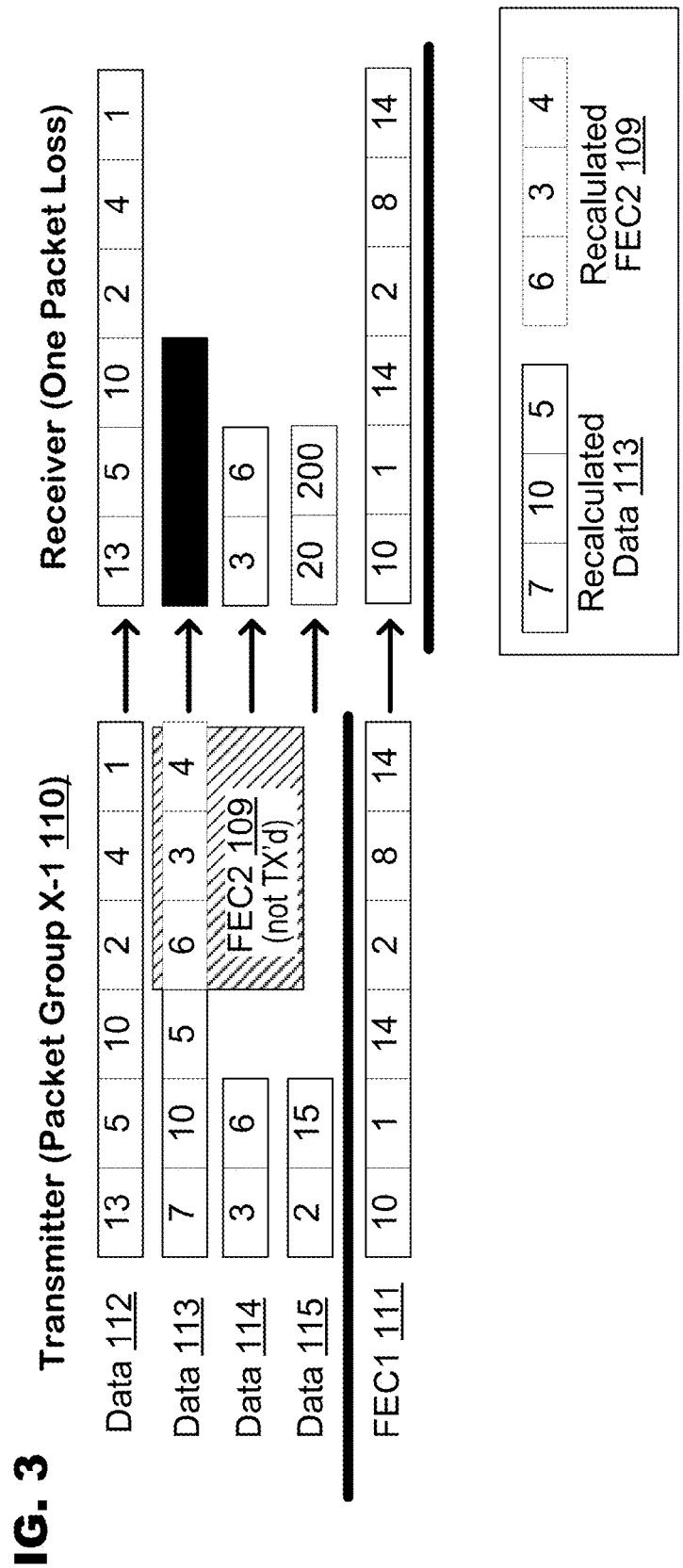
FIG. 3 shows a first example of how one lost packet with symbols in non-overlapping locations of appended FEC2 symbol values may be recalculated in an embodiment.

FIG. 3 shows an example of how one lost packet having appended FEC2 symbol values may be recalculated in an embodiment. The embodiment shown in FIG. 3 is the same as that shown in FIGS. 2a and 2b, except in this case one of the data packets, data packet 113, may be lost during transmission and therefore may not be received at the receiver end. Since the FEC2 value 109 was also appended to data packet 113 but not transmitted, the loss of data packet 113 and FEC2 value 109 are treated as a single lost packet, and thus it may be possible to recalculate both lost data packet 113 as well as the FEC2 value 109 that was not transmitted by applying the corresponding decoding function to the three data packets (data packets 112, 114, and 115) and FEC1 packet 111 that were received. Header information in FEC1 packet 111 may be used to identify the number of symbols and locations of data packet 113. From this the number of symbols in and location where the FEC2 value 109 was added to the data packets 113 may be calculated when applying the decoding function, which may be result in the reconstruction of appended data packet 113 with FEC2 value 109. Since the header information disclose the size of data packet 113, the FEC2 value 109 can thus be inferred from the extra information in the reconstructed packet.

Figure 4:
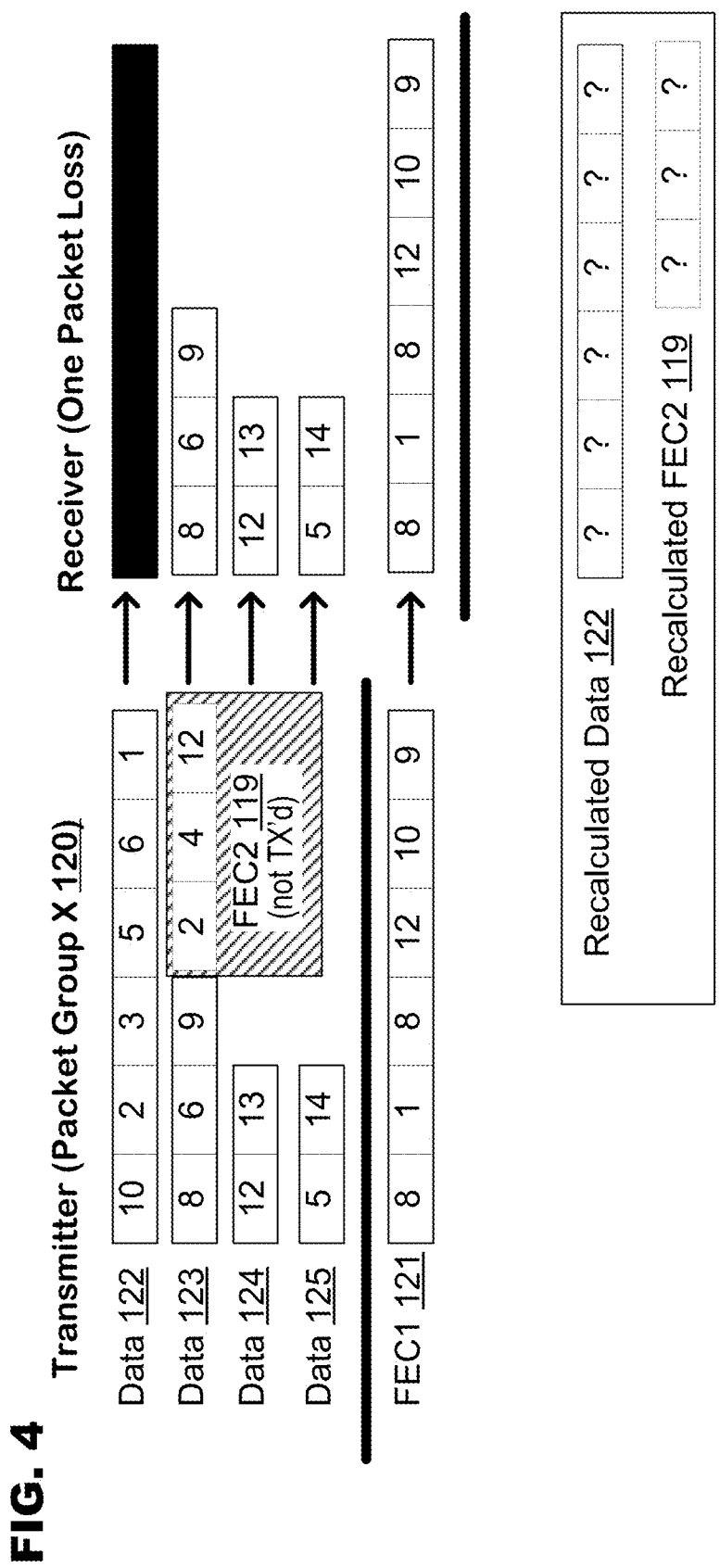
FIG. 4 shows a second example of how one lost packet may not be recalculated in an embodiment.

FIG. 4 shows an example of how one lost packet may not be recalculated in an embodiment from information received in that packet group. In this figure, packet group X 120 with data packets 122 to 125 may be transmitted. Prior to generating a FEC1 packet 121 for these data packets in packet group X 120, a processing device may append the calculated value of FEC2 119 from a prior group of data packets (not shown) to one or more data packets in the current group of data packets (in this case data packets 122 to 125 would be in the current group). In some embodiments, the calculated value of FEC2 119 may be appended to one or more data packets in the current group that are shorter than the longest packet in the group (in this case data packets 123, 124, and 125 are all shorter than the longest data packet 122), or the calculated value of FEC2 119 may be considered to be a separate packet even though the FEC2 packet 119 may not be transmitted. The FEC1 packet 121 may be calculated by applying an error correction coding function, such as a Reed-Solomon code, to data packets 122 to 125 with the appended FEC2 value 119 or to data packets 122 to 125 and the FEC2 value 119 if the FEC2 value 119 was not appended but considered as a separate packet instead.

In instances where the calculated value of FEC2 119 may be appended to one or more of these shorter data packets, the FEC2 119 value may be appended so that the total length of each data packet in the group with the FEC2 119 bits appended does not exceed the length of the longest data packet in the group (in this case data packet 122). If the calculated value of FEC2 119 is appended to more than one data packet by subdividing FEC2 119, FEC2 119 may be appended to the multiple data packets so that there is no overlap of FEC2 119 bit values in each location when calculating FEC1 121.

The FEC2 value 119 and other FEC2 values may not be transmitted with data packets, such as packets 122 to 125. Although the value of FEC2 119 is shown as appended to data packet 123, FEC2 119 could have been appended to data packets 124 or 125 instead. Alternatively, one of the symbols of FEC2 119 (such as the symbol number 2) could have been appended to data packet 124 or 125 and the other two symbols (such as 4 and 12) could have been appended to data packet 123.

As stated previously, FEC2 values may be calculated by applying a high order polynomial or other error correcting function to the data packets in the preceding group of packets and previously calculated FEC2 values for the preceding group.

The right side of FIG. 4 shows the packets that are received at a corresponding receiver. Assuming packet 122 is lost during transmission, then only packets 123 to 125 and FEC1 packet 121 may be received at the receiver. By applying a corresponding decoding function to the received FEC1 parity packet 121 and the received packets 123, 124 and 125, it may not be possible to recalculate data packet 122 and/or FEC2 value 119 that was not transmitted solely from the packets received in FIG. 4 for packet group X 120.

While it may not be possible to recalculate lost data packet 122 or FEC2 value 119 from the received packets 121, 123, 124, and 125 in group X 120, it may be possible to fully recalculate lost packet 122 and FEC2 value 119 depending on the packets received from the next packet group X+1. If, for example, all of the data packets and the FEC1 packet in group X+1 are received, then it may be possible to recalculate FEC2 for group X+1 from the received packets. The recalculated FEC2 value for group X+1, which may have been originally calculated from the data packets 122 to 125 and FEC2 value 119 from the previous packet group X 120, may be used to recalculate lost data packet 122 and FEC2 value 119.

Figure 5:
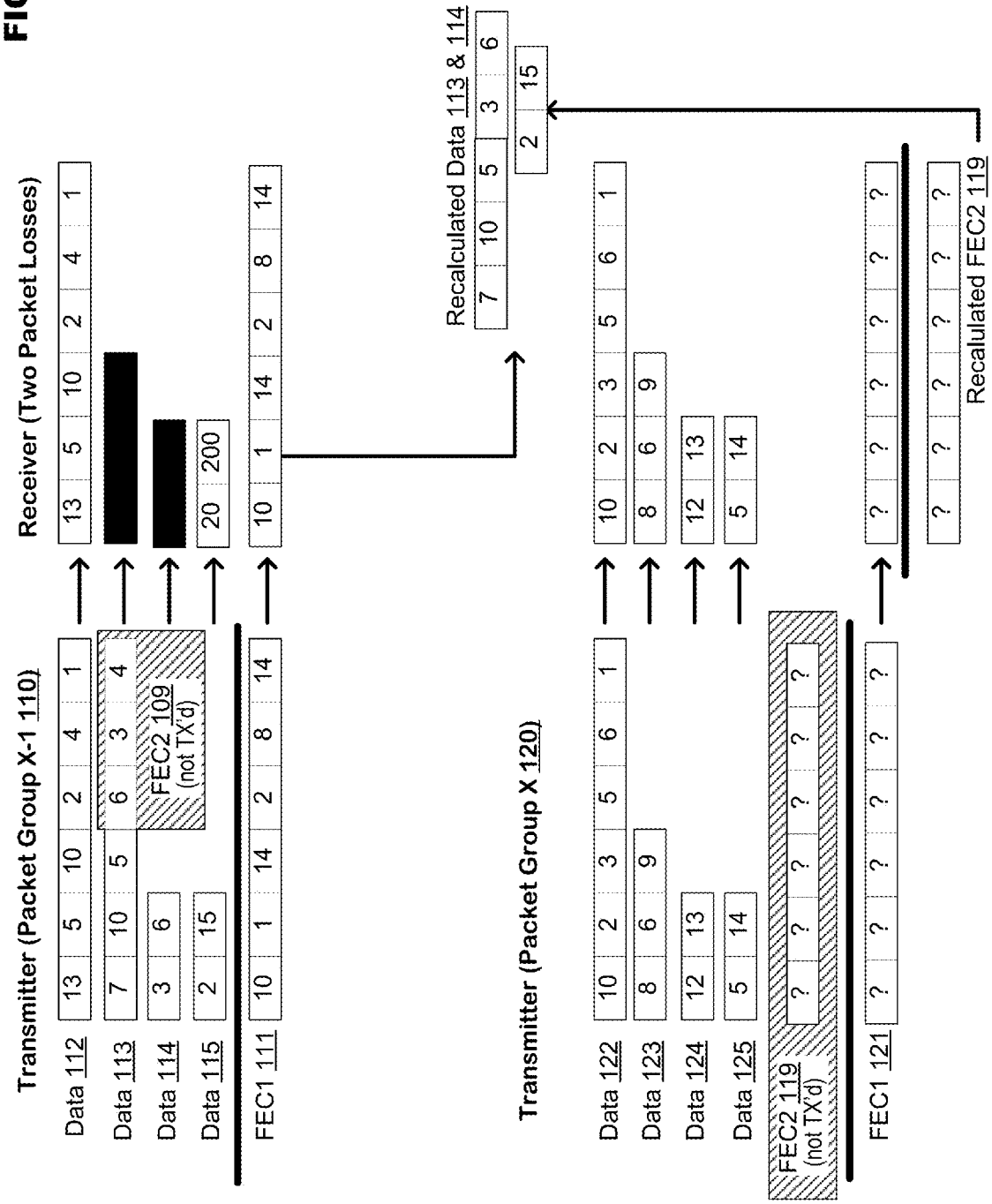
FIG. 5 shows a third example of how two packet losses in a first packet group may be recovered if each of the packets in the next group are successfully received in an embodiment.

FIG. 5 shows an example of how two packet losses in a first packet group X−1 110 may be recovered if each of the packets in the next group X 120 are successfully received in an embodiment. If data packets 113 and 114 in group X−1 110 are lost during transmission, then only packets 111, 112, and 115, may be received at the receiver.

If all the transmitted packets 121 to 125 in group X 120 are also received, then it may be possible to recalculate FEC2 119 by applying a decoding function to packets 121 to 125. Since the FEC2 value 119 in packet group X 120 are based on the data packets 112 to 115 and FEC2 value 109 of the previous group X−1 110, it may be possible to recalculate data packet 113 (with appended FEC2 value 109) and data packet 114 from the remaining successfully received packets in groups X−1 110 and X 120 together with the recalculated FEC2 value 119.

Figure 6:
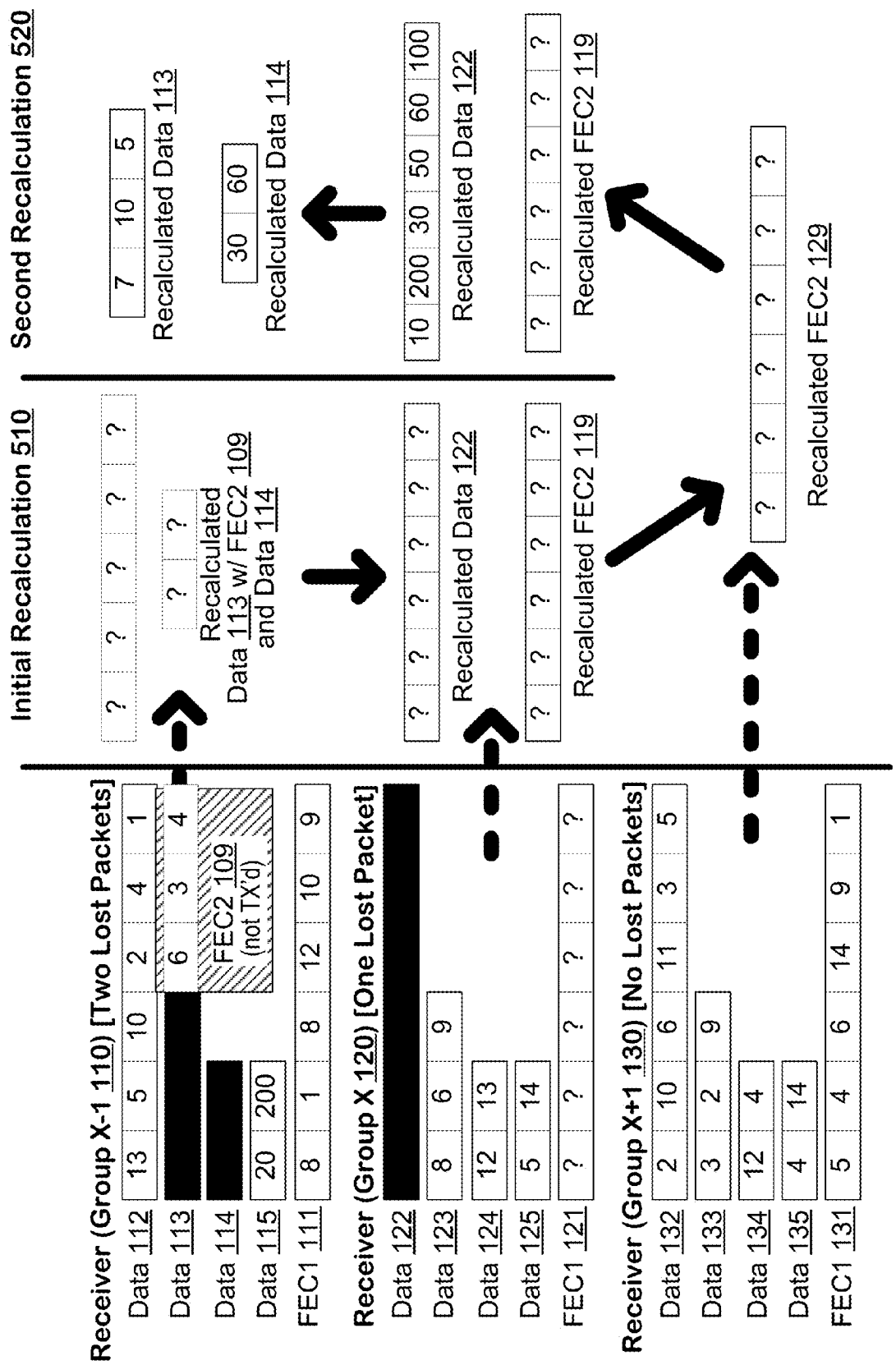
FIG. 6 shows a fourth example of how two packet losses in a first packet group and one packet loss in a second packet group may be recovered if each of the packets in the following group are successfully received in an embodiment.

FIG. 6 shows an example of how two packet losses in a first packet group X−1 110 and one packet loss in a second packet group X 120 may be recovered if each of the packets in the following group X+1 130 are successfully received in an embodiment.

If data packets 113 and 114 in group X−1 110 are lost during transmission, then only packets 111, 112, and 115, may be received at the receiver. If data packet 122 in group X 120 is lost during transmission, then only packets 121, 123, 124, and 125 may be received at the receiver.

If all the transmitted packets 131 to 135 in group X+1 130 are also received, then it may be possible to recalculate FEC2 129 from data packets 132 to 135 and FEC1 packet 131. From recalculated FEC2 129, and successfully received packets 121, 123, 124, and 125, it may be possible to recalculate FEC2 119 and Data packet 122. From this and successfully received packets 111, 112, and 115, it may be possible to recalculate data packet 113, including appended FEC2 109, and data packet 114.

Figure 7:
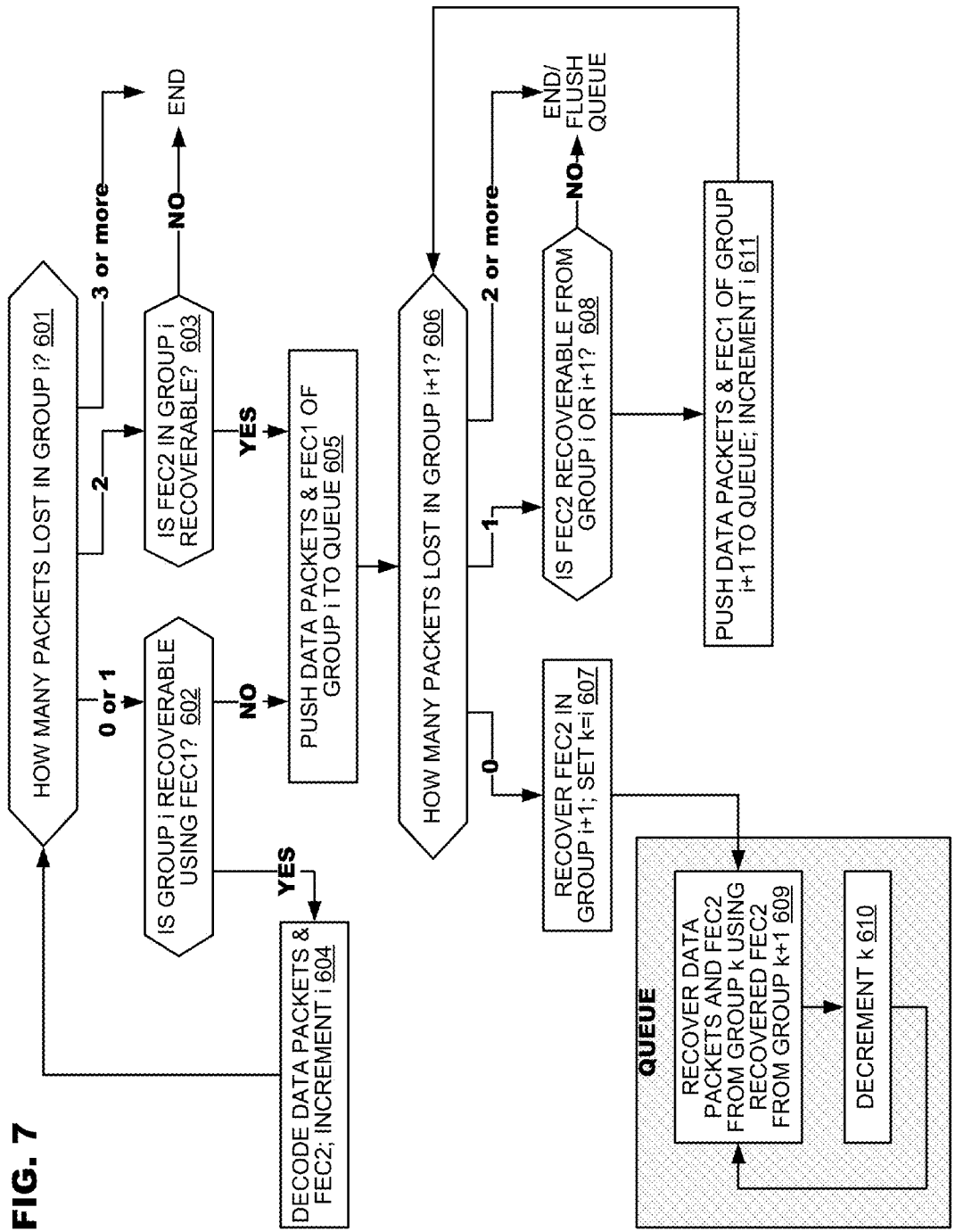
FIG. 7 shows another exemplary process of how lost packets may be recovered in an embodiment.

FIG. 7 shows an example of how lost packets may be recovered in an embodiment. In box 601, a packet group may be examined to identify a quantity of lost packets in a group i. If the process is starting from a first packet group, then the counter i may equal one.

If zero or one packets are identified as lost or not received at the receiver in box 601, the packet group may be further examined in box 602 to determine whether all of the transmitted packets in the group were successfully received at the receiver or are recoverable using the FEC1 parity packet in packet group by simple subtraction.

If the packets in the group were successfully received or are recoverable using the FEC1 parity packet in the packet group, then in box 604 the data packets and FEC2 value appended to data packets in the packet group are decoded and the process may continue in box 601 with the next packet group by incrementing i.

If three or more packets are identified as lost or not received at the receiver in box 601, the process may end.

If two packets are identified as lost or not received at the receiver in box 601, the packet group may be further examined in box 603 to determine whether a FEC2 value added to the packets in the group is recoverable from the remaining packets that were successfully received. If the FEC2 value is not recoverable, the process may end.

If either the packets in the box 602 are not recoverable using the FEC1 parity packet in the packet group or FEC2 value in box 603 is recoverable from the remaining successfully received packets, then in box 605, the successfully received packets may be sent to a queue and the process may proceed to box 606.

In box 606 the next group of packets, group i+1, may be examined to determine the number of lost packets. If two or more packets are determined to be lost in group i+1, the process may end and the queue may be flushed.

If one packet is determined to be lost in group i+1, in box 608, the packets in group i+1 may be further examined to determine whether the FEC2 value appended to the packets in group i+1 but not transmitted may be recalculated from the remaining packets that were successfully received. If the FEC2 value can not be recalculated from the remaining received packets, the process may end and the queue may be flushed.

If the FEC2 value can be recalculated from the remaining received packets, in box 611 the packets in group i+1, which may include the FEC1 packet, may be sent to the queue, the counter i may be incremented by one, and the packets in the following group may be examined as the process returns to box 606.

If, after examining the packets in group i+1 in box 606, it is determined that no packets have been lost, then in box 607 the FEC2 value appended to the packets in group i+1 but not transmitted may be recalculated, a second counter k may be set equal to the current value of the first counter i, and the process may continue in box 609.

In box 609 the data packets in group k and FEC2 value appended to the packets of group k but not transmitted may be recalculated by using, in part, the recovered FEC2 value from the subsequent packet group k+1, after which the counter k may be decremented by one in box 610 and the process in box 609 may repeat using the newly decremented value of k. This may continue until all the packets in the queue have been processed, at which time the queue may be flush and the process may continue in box 601 after incrementing the first counter i to continue examining the number of packets lost in the following group of packets. This process may continue until all groups of packets have been examined or the process has been ended.

FIG. 8 shows an exemplary encoder and decoder configuration 800 that may be used in an embodiment. In this example, a source of video 805 may be coupled to an encoder 810. The encoder 810 may encode the video signals from the source 805 into packets and transmit the packets over a network or data channel 830. A video decoder 820 may received the packets transmitted over the network or data channel 830 and recreate a video signal after decoding the received packets. The video signal may be presented on a display or stored on a video recording medium. The source of video 805 may be any source of video, including but not limited to, a computer readable storage medium, a camera, a DVD, or other source.

Encoder 810 and/or decoder 820 may include a processing device to perform computation and control functions of a system, which may be done through a suitable central processing unit (CPU). Processing device may include a single integrated circuit, such as a microprocessing device, or any suitable number of integrated circuit devices and/or circuit boards working in cooperation to accomplish the functions of a processing device.

FIG. 9 shows an exemplary configuration 900 of a transmitter 910 in an encoder 810 and a receiver 970 in a decoder 820 in an embodiment. A transmitter 910 may include an application layer 920 and communication layer 930 and a receiver 970 may also include an application layer 980 and communication layer 990. The application layer 920 may include a video coding engine 921 to convert a video signal from source 805 into data packets. The video coding engine may also be coupled to a forward error corrector circuit that may calculated, append, and/or add forward error correction values and/or packets to the data packets. After the forward error correction calculations and/or additions to the data packets are complete, the packets may be sent to a transmission buffer 923 which may store the packets until the are ready to be transmitted by communications layer 930.

The communications layer 930 may format the packets, such as packets 951, 952, and 953, for transmission over a channel 954 and then transmit the formatted packets over the channel 954. Communications layer 990 at the receiver 970 may receive the transmitted packets, reformat the packets for compatibility with the application layer and send the reformatted packets to the application layer. Communications layers 930 and 990 may contain functionality to correct and/or resend packets with data error so that each packet that is sent to the application layer 980 at the receiver 970 contains the correct data, though packets that are lost during transmission may nonetheless not be sent to the application layer 980.

The application layer 980 may contain a reception buffer 983 to store the packets received from the communications layer 990 until they are ready to be processed by the error corrector 982. The error corrector 982 may examine the packets stored in the buffer 983, check the packets for missing packets and/or other errors, and recreate missing packets and/or fix other errors if such correction is possible. The examined and/or corrected packets may then be sent to a video decoding engine 981 to reconvert them to a video signal from packets.

The foregoing description has been presented for purposes of illustration and description. It is not exhaustive and does not limit embodiments of the invention to the precise forms disclosed. Modifications and variations are possible in light of the above teachings or may be acquired from the practicing embodiments consistent with the invention. For example, some of the described embodiments may include software and hardware, but some systems and methods consistent with the present invention may be implemented in software or hardware alone. Additionally, although aspects of the present invention are described as being stored in memory or a video recording medium, this may include other computer readable media, such as secondary storage devices, for example, hard disks, floppy disks, or CD ROM; the Internet or other propagation medium; or other forms of RAM or ROM.

We claim:

1. A transmission method, comprising:
organizing data packets for transmission into packet groups,
for each respective packet group, generating a plurality of FEC packets according to at least one forward error correction (FEC) formula, each FEC packet generated from data packets of the respective packet group and from a FEC packet generated for a prior packet group, the prior packet group being prior to the respective packet group, and
transmitting the data packets and a subset of the FEC packets to a receiver.

2. A reception method, comprising:
receiving data packets and forward error correction (FEC) packets from a transmitter and identifying a sequence of packet groups therefrom, each FEC packet generated from data packets of the respective packet group and from an untransmitted FEC value of a prior packet group the prior packet group being prior to the respective packet group;
identifying a first packet group in the sequence with recoverable data packets and a recoverable untransmitted FEC value; and
iteratively recovering the data packets and the untransmitted FEC value from the identified first packet group and any preceding groups in the sequence.

3. A method comprising:
identifying groups of packets with data for transmission;
generating a plurality of forward error correction (FEC) values for each respective group from at least one mathematical function applied to data in the respective group and to at least one FEC value from a previous group, wherein the at least one FEC value from the previous group is embedded in the respective group; and
transmitting a subset of generated FEC values with the groups, the subset of generated FEC values excluding embedded FEC values.

4. The method of claim 3, wherein a first and second mathematical functions generate a first and second FEC value for each of the identified groups.

5. The method of claim 4, wherein the first and second mathematical functions are applied to data packets including the data and to the second FEC value from the previous packet group.

6. The method of claim 5, wherein only the first FEC values are transmitted with the groups.

7. The method of claim 6, wherein the first mathematical FEC function is a linear parity error correction coding function.

8. The method of claim 6, wherein the second mathematical FEC function is a polynomial error correction coding function.

9. The method of claim 6, wherein the second mathematical FEC function is a Reed-Solomon coding function.

10. The method of claim 6, wherein the first and second mathematical FEC functions are independent.

11. The method of claim 5, wherein the second FEC value is not transmitted.

12. The method of claim 6, wherein the first FEC value is embedded in a FEC packet and the FEC packet is transmitted.

13. The method of claim 12, wherein the FEC packet is transmitted as part of its respective group of packets before being transmitted.

14. The method of claim 6, wherein a packet header includes a size of each data packet in a packet group.

15. The method of claim 6, wherein the data packets in the packet group have variable sizes and the size of each data packet in the packet group is transmitted.

16. The method of claim 15, wherein the second FEC value in the packet group is appended to at least one of the data packets in the packet group and the first and second mathematical functions are applied to the values of data packets in the packet group with the appended second FEC value.

17. The method of claim 16, wherein the second FEC value in the packet group is not appended to a longest sized data packet in the packet group.

18. The method of claim 16, wherein a total size of each appended data packet is at most equal to that of a longest non-appended data packet in the packet group.

19. The method of claim 18, wherein the second FEC value is appended to more than one of the data packets and the second FEC value is subdivided between the data packets to prevent overlap between each subdivision.

20. The method of claim 6, wherein the data for transmission includes video data.

21. A system comprising:
an encoder to generate a plurality of forward error correction (FEC) values including a FEC value for transmission and an untransmitted FEC value for each respective group of packets to be transmitted, the FEC values calculated from a mathematical function applied to data in the respective group of packets and to an untransmitted FEC value from a group of packets previous to the respective group of packets; and
a transmitter to transmit each respective group of packets with the FEC value for transmission with the respective group of packets.

22. A system comprising:
a receiving device to receive a sequence of packet groups, each respective packet group originally including data packets and a forward error correction (FEC) packet calculated from data packets in the respective packet group and an untransmitted FEC value for a preceding packet group, the preceding packet group preceding the respective packet group; and
a decoding device to identify a first packet group in the sequence with recoverable data packets and a recoverable untransmitted FEC value and to recursively recover the data packets and the untransmitted FEC values from the identified first packet group and any packet groups preceding the identified first packet group.

23. The transmission method of claim 1, wherein the forward error correction formula includes adding redundant information to the generated FEC packets to reconstruct lost packets.

24. A transmission method, comprising:
organizing data packets for transmission into packet groups,
for a first packet group, generating a plurality of FEC packets according to at least one forward error correction (FEC) formula, each FEC packet generated from data packets of the first packet group and from a FEC packet generated for a prior packet group relative to the first packet group, wherein said generating is performed for each of the packet groups, and
transmitting the data packets and a subset of the FEC packets to a receiver.

25. A transmission method for performing a first transmission of first data packets, comprising:
organizing the first data packets for transmission into packet groups,
for each packet group, generating a plurality of FEC packets according to at least one forward error correction (FEC) formula, each FEC packet generated from data packets of the packet group and from a FEC packet generated for a prior packet group from a prior transmission, and
transmitting the data packets and a subset of the FEC packets to a receiver.

26. A transmission method comprising:
organizing data packets for transmission into a plurality of packet groups;
generating a first plurality of FEC packets associated with a first packet group from the plurality of packet groups, according to at least one forward error correction (FEC) formula, wherein each FEC packet of the first plurality of FEC packets is generated from data packets of the first packet group and from at least one of a second plurality of FEC packets associated with a second packet group from the plurality of packet groups, wherein the second packet group precedes the first packet group in the plurality of packet groups; and
transmitting the data packets of the first packet group and a subset of the first plurality of FEC packets to a receiver.

* * * * *